US008886483B2

(12) United States Patent
Zhao

(10) Patent No.: US 8,886,483 B2
(45) Date of Patent: Nov. 11, 2014

(54) IMAGE ENHANCEMENT FOR RESISTIVITY FEATURES IN OIL-BASED MUD IMAGE

(75) Inventor: Jinsong Zhao, Houston, TX (US)

(73) Assignee: Baker Hughes Incorporated, Houston, TX (US)

( * ) Notice: Subject to any disclaimer, the term of this patent is extended or adjusted under 35 U.S.C. 154(b) by 120 days.

(21) Appl. No.: 13/221,251

(22) Filed: Aug. 30, 2011

(65) Prior Publication Data
US 2012/0059616 A1  Mar. 8, 2012

Related U.S. Application Data
(60) Provisional application No. 61/380,895, filed on Sep. 8, 2010.

(51) Int. Cl.
| | | |
|---|---|---|
| *G01D 18/00* | (2006.01) | |
| *G01P 21/00* | (2006.01) | |
| *G01R 35/00* | (2006.01) | |
| *G01V 3/20* | (2006.01) | |
| *E21B 49/00* | (2006.01) | |

(52) U.S. Cl.
CPC . *G01V 3/20* (2013.01); *E21B 49/00* (2013.01); *G01R 35/00* (2013.01)
USPC .............................................. 702/85; 702/11

(58) Field of Classification Search
CPC ...... G01R 35/00; G01R 35/005; E21B 49/00; G01V 11/00; G01V 1/50; G01V 1/30; G01V 1/48; G01D 18/00
USPC ....................................................... 702/85, 11
See application file for complete search history.

(56) References Cited

U.S. PATENT DOCUMENTS

| | | | |
|---|---|---|---|
| 5,486,695 A | 1/1996 | Schultz et al. | |
| 7,282,704 B2 | 10/2007 | Guo | |
| 7,299,175 B2 * | 11/2007 | Chen et al. | 704/224 |
| 7,301,338 B2 | 11/2007 | Gillen et al. | |
| 7,558,675 B2 * | 7/2009 | Sugiura | 702/9 |
| 7,579,841 B2 | 8/2009 | San Martin et al. | |
| 7,689,363 B2 | 3/2010 | Itskovich et al. | |
| 7,855,560 B2 | 12/2010 | Zhao et al. | |
| 8,115,490 B2 | 2/2012 | Gorek et al. | |
| 2003/0016164 A1 * | 1/2003 | Finke et al. | 342/83 |
| 2003/0035564 A1 * | 2/2003 | Honsinger et al. | 382/100 |
| 2003/0101806 A1 | 6/2003 | Kurkoski | |
| 2005/0075853 A1 | 4/2005 | Spross | |
| 2008/0083872 A1 * | 4/2008 | Huiszoon | 250/269.3 |
| 2009/0196120 A1 * | 8/2009 | Geerits | 367/35 |
| 2009/0201764 A1 | 8/2009 | Liu | |
| 2009/0295392 A1 | 12/2009 | Feng | |
| 2010/0039115 A1 * | 2/2010 | Bespalov et al. | 324/355 |
| 2010/0052687 A1 * | 3/2010 | Forgang et al. | 324/333 |
| 2010/0271031 A1 * | 10/2010 | Behnsen et al. | 324/355 |
| 2011/0202800 A1 * | 8/2011 | Mackey et al. | 714/37 |

* cited by examiner

*Primary Examiner* — Michael Nghiem
(74) *Attorney, Agent, or Firm* — Mossman Kumar & Tyler PC

(57) ABSTRACT

An apparatus and method for estimating a parameter of interest of an earth formation. An apparatus includes an elongated support member; a primary transmitter on the elongated support member; and a receiver toroid on the elongated support member, the receiver toroid being positioned transversely on the elongated support member and including a single coil antenna. Methods include positioning a logging tool in a borehole in the earth formation; using a transverse receiver toroid on an elongated support member on the logging tool, wherein the transverse receiver toroid includes a single coil antenna; and producing a signal responsive to an electrical signal produced by a primary transmitter.

19 Claims, 7 Drawing Sheets

IMAGE ENHANCEMENT FOR RESISTIVITY FEATURES IN OIL-BASED MUD IMAGE

CROSS-REFERENCES TO RELATED APPLICATIONS

This application claims priority from U.S. Provisional Patent Application Ser. No. 61/380,895, filed on Sep. 8, 2010, incorporated herein by reference in its entirety.

BACKGROUND OF THE DISCLOSURE

1. Field of the Disclosure

This disclosure generally relates to explorations for hydrocarbons involving electrical investigations of a borehole penetrating an earth formation. More specifically, this disclosure relates to a method and apparatus for processing the image obtained by a resistivity imaging tool in oil-based mud

2. Background of the Art

Resistivity imaging tools have been in widespread use for several years for obtaining resistivity images of walls of boreholes drilled in an earth formation. Oil-based muds must be used when drilling through water soluble formations: an increasing number of present day exploration prospects lay beneath salt layers. Besides reducing the electrical contact between the logging tool and the formation, invasion of porous formations by a resistive, oil-based mud may greatly reduce the effectiveness of typical resistivity imaging devices. This problem is not alleviated by the use of focusing electrodes.

The prior art devices, being contact devices, are sensitive to the effects of borehole rugosity—the currents flowing from the electrodes depend upon good contact between the electrode and the borehole wall. If the borehole wall is irregular, the contact and the current from the electrodes may be irregular, resulting in inaccurate imaging of the borehole. A second drawback is the relatively shallow depth of investigation caused by the use of measure electrodes at the same potential as the pad and the resulting divergence of the measure currents.

Another drawback involving the use of contact devices injecting electrical currents into a wellbore may arise when oil-based muds are used in drilling. Oil-based muds may be used when drilling through water soluble formations as an increasing number of present day exploration prospects lay beneath salt layers. In addition to reducing the electrical contact between the logging tool and the formation, invasion of porous formations by a resistive, oil-based mud may greatly reduce the effectiveness of typical resistivity imaging devices. This problem may not alleviated by the use of focusing electrodes. Standoff changes and leakage currents may degrade the quality of the image produced by a typical resistivity tools. The present disclosure is directed to methods of processing the image to improve the data quality and eliminate systematic and random noise in the image.

SUMMARY OF THE DISCLOSURE

One embodiment of the disclosure is a method of evaluating an earth formation. The method includes: conveying a carrier into a borehole; making measurements indicative of a property of the earth formation using an array of sensors on each of a plurality of support members coupled to the carrier wherein at least one of the plurality of support members has a different standoff from a borehole wall than at least one other of the plurality of support members; and using a processor for compensating for an effect on the measurements of a difference in standoff and producing an image of the earth formation. Compensating for the effect of the difference in standoff may further comprise an entropy equalization and normalization of measurements made by the array of sensors on each of the plurality of support members. Compensating for the effect of the difference in standoff may further comprise an entropy equalization and normalization using an image and a first moment of the image. Compensating for the effect of the difference in standoff may further comprise a bandpass filtering.

One embodiment of the disclosure is an apparatus configured to evaluate an earth formation. The apparatus includes: a carrier configured to be conveyed into a borehole; an array of sensors on each of a plurality of support members coupled to the carrier, each of the arrays of sensors being configured to make measurements indicative of a property of the earth wherein at least one of the plurality of support members has a different standoff from a borehole wall than at least one other of the plurality of support member; and a processor configured to: compensate for an effect on the measurements of a difference in standoff and; and produce an image of the earth formation. Compensating for the effect of the difference in standoff may further comprise an entropy equalization and normalization of measurements made by the array of sensors on each of the plurality of support members. Compensating for the effect of the difference in standoff may further comprise an entropy equalization and normalization using an image and a first moment of the image. Compensating for the effect of the difference in standoff may further comprise a bandpass filtering. The processor may be further configured to compensate for random noise in the measurements, such as, for example, by further performing an azimuthal filtering.

Another embodiment of the disclosure is a non-transitory computer-readable medium product having thereon instructions that when read by a processor cause the processor to execute a method. The method includes: conveying a carrier into a borehole; making measurements indicative of a property of the earth formation using an array of sensors on each of a plurality of support members coupled to the carrier wherein at least one of the plurality of support members has a different standoff from a borehole wall than at least one other of the plurality of support members; and using a processor for compensating for an effect on the measurements of a difference in standoff and producing an image of the earth formation. Compensating for the effect of the difference in standoff may further comprise an entropy equalization and normalization of measurements made by the array of sensors on each of the plurality of support members. Compensating for the effect of the difference in standoff may further comprise an entropy equalization and normalization using an image and a first moment of the image. Compensating for the effect of the difference in standoff may further comprise a bandpass filtering.

BRIEF DESCRIPTION OF THE FIGURES

The present disclosure is best understood with reference to the following figures in which like numerals refer to like elements and in which.

DETAILED DESCRIPTION OF THE DISCLOSURE

Figures 1A, 1B:
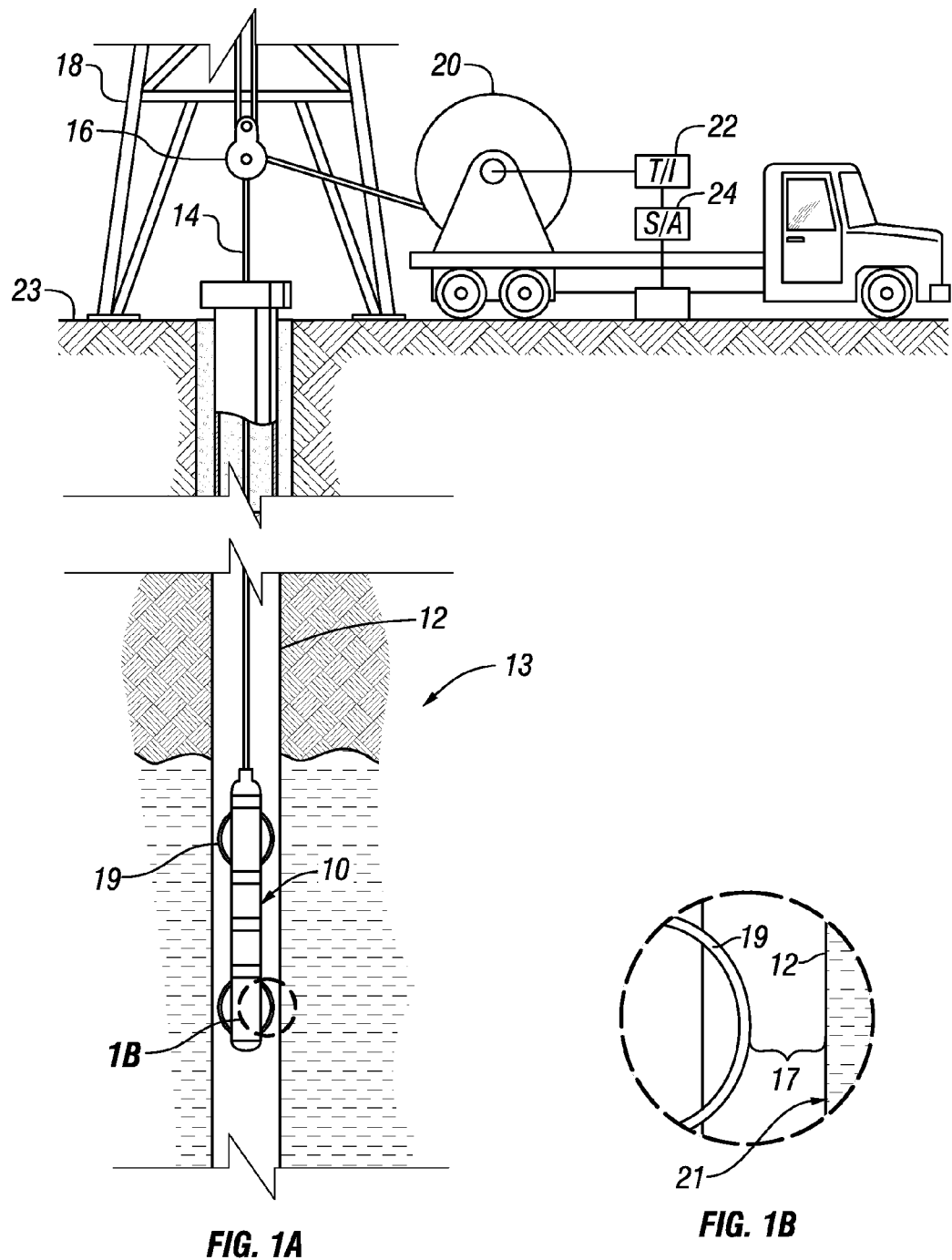
FIG. 1A shows an exemplary imaging tool suspended in a borehole according to one embodiment of the present disclosure.
FIG. 1B shows an enlarged view of the exemplary imaging tool suspended in a borehole according to one embodiment of the present disclosure.

FIGS. 1A and 1B show an imaging tool 10 suspended in a borehole 12, that penetrates earth formations such as 13, from a suitable cable 14 that passes over a sheave 16 mounted on drilling rig 18. Imaging tool 10 includes a plurality of support members 19 with each support member 19 having a standoff 17 from the borehole wall 21. By industry standard, the cable 14 includes a stress member and seven conductors for transmitting commands to the tool and for receiving data back from the tool as well as power for the tool. The tool 10 may be raised and lowered by draw works 20. Electronic module 22, on the surface 23, may transmit required operating commands downhole and, in return, receive data back which may be recorded on an archival storage medium of any desired type for concurrent or later processing. The data may be transmitted in analog or digital form. Data processors such as a suitable computer 24, may be provided for performing data analysis in the field in real time or the recorded data may be sent to a processing center or both for post processing of the data.

Figure 2A:
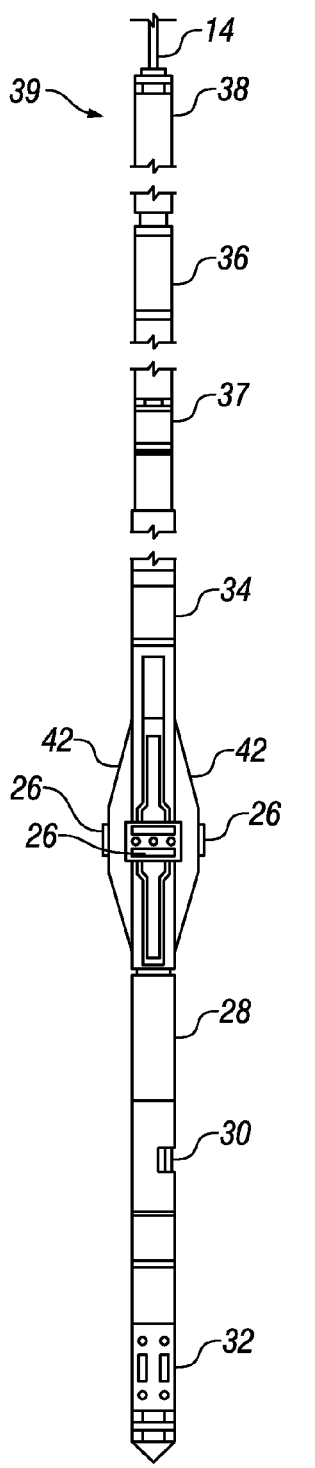
FIG. 2A shows a mechanical schematic view the exemplary imaging tool.

FIG. 2a is a schematic external view of a borehole sidewall imager system. The tool 10 comprising the imager system includes resistivity arrays 26 and, optionally, a mud cell 30 and a circumferential acoustic televiewer 32. Electronics modules 28 and 38 may be located at suitable locations in the system and not necessarily in the locations indicated. The components may be mounted on a mandrel 34 in a conventional well-known manner (e.g., resistivity arrays 26 may be mounted on pad 40 on support 42). The outer diameter of the assembly may be about 5 inches and the assembly may be about fifteen feet long. An orientation module 36 including a magnetometer and an accelerometer or inertial guidance system may be mounted above either arrays 26 or circumferential acoustic televiewer 32. The upper portion 39 of the tool 10 contains a telemetry module for sampling, digitizing and transmission of the data samples from the various components uphole to surface electronics 22 in a conventional manner. If acoustic data are acquired, they are preferably digitized, although in an alternate arrangement, the data may be retained in analog form for transmission to the surface where it is later digitized by surface electronics 22. For the purposes of the present disclosure, the mandrel 34 may be referred to as a carrier.

Figure 2B:
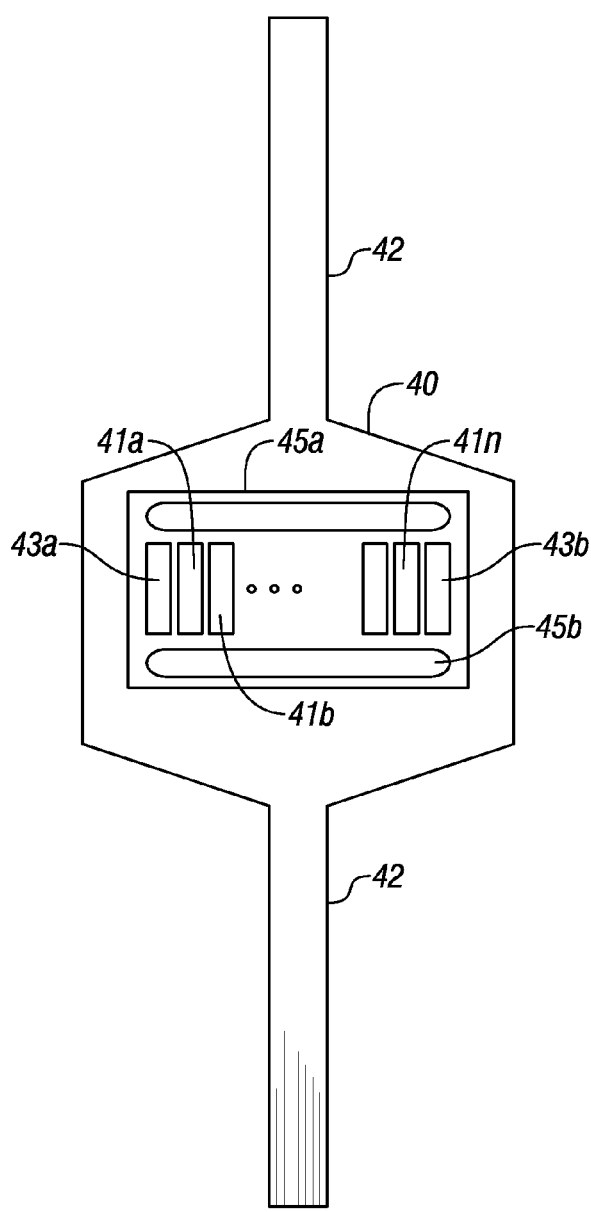
FIG. 2B shows a detailed view of an imaging pad according to one embodiment of the present disclosure.

Also shown in FIG. 2a are three resistivity arrays 26 (a fourth array is hidden in this view). Referring to FIGS. 2a and 2b, each array includes measure electrodes 41a, 41b, ... 41n for injecting electrical currents into the formation, focusing electrodes 43a, 43b for horizontal focusing of the electrical currents from the measure electrodes and focusing electrodes 45a, 45b for vertical focusing of the electrical currents from the measure electrodes. By convention, "vertical" refers to the direction along the axis of the borehole and "horizontal" refers to a plane perpendicular to the vertical. The pad 40 carrying the resistivity arrays may be referred to as a support member.

In one embodiment of the disclosure, the measure electrodes may be rectangular in shape and oriented with the long dimension of the rectangle parallel to the tool axis. Other electrode configurations using circular button electrodes may be used. All such embodiments are within the scope of the present disclosure.

Embodiments of the present disclosure may be configured to operate in the frequency range of 10 MHz-40 MHz compared to a frequency of 1 MHz for prior art tools. The advantage of operating at a higher frequency is to reduce the imaginary part of the impedance. The tool may therefore be more sensitive to formation resistivity than lower frequency tools. Since a complex impedance measurement may be used, the tool may generate outputs of two images, real and imaginary. The formation impedance and the standoff capacitance affect both components of the image.

Figure 3A:
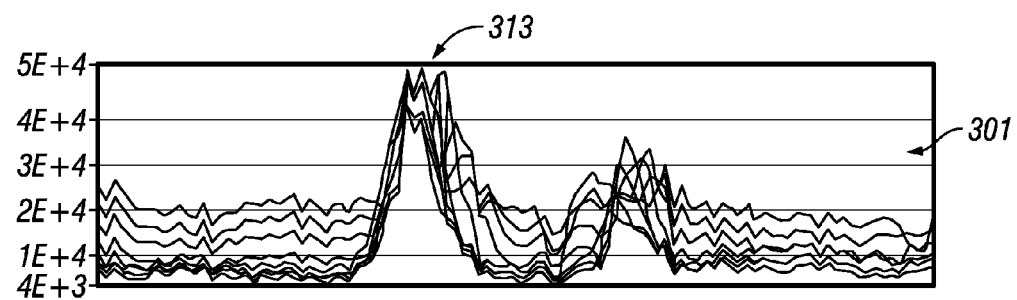
FIGS. 3A-3B shows charts illustrating the problem of high contrast bar/block noise in a resistivity image.
Figures 7A, 7B:
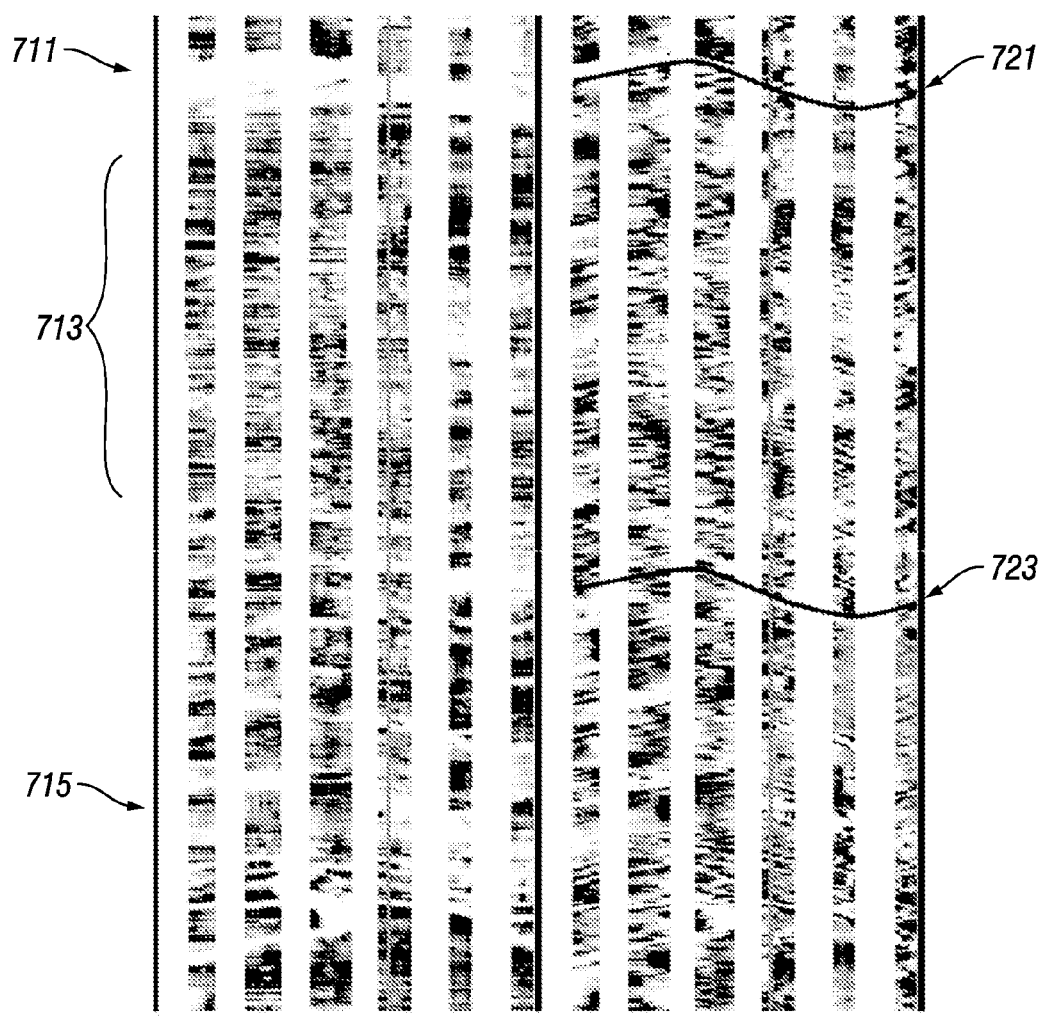
FIGS. 7A-B shows an example of the results of using the processing method of the present disclosure.

There are several problems associated with measurements made by a resistivity imaging device of the type described above. Typically, an image is obtained by an imaging tool having six pads. An example of an image is shown in FIG. 7a. The images produced by the individual pads can be seen in the six panels of 701. In this example, there are ten electrodes on each pad. The panel 301 in FIG. 3a shows the amplitude of the resistivity measured by the individual electrodes made by a particular pad—ten curves can be seen. The panel 303 in FIG. 3b shows the phase of the resistivity measured by the individual electrodes corresponding to the amplitudes shown in FIG. 3a.

Figure 3B:
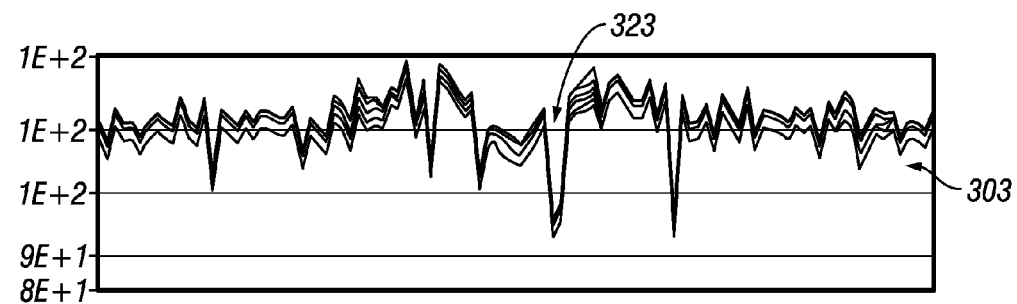

Attention is first drawn to the portion indicated by 313 in FIG. 3b. The arrow points to a particularly noisy portion of the image, and the arrow 313 shows that all ten of the electrodes have unusually high amplitudes. This manifests itself as a bar in the image produced (not shown) by that particular pad. This noise is coherent from button to button but is limited to one particular pad. In all likelihood, this coherence is due to a large standoff of the pad from the borehole wall. The arrow 323 points to another noisy portion of the image, which is characterized by a change in phase of the signal without a significant change in amplitude. To summarize, bar/block noises are highly correlated across channels (buttons) on each pad but not necessarily correlated across pads. When standoff changes, the leakage correct may generate high contrast with high spatial frequency noisy patterns that entirely damages (flood over) the resistivity formation texture image visualization with very poor image perceptual quality, especially, in low resistivity zones where the resistivity signal and the image contrast in the adjacent area is relatively small.

Figure 4A:
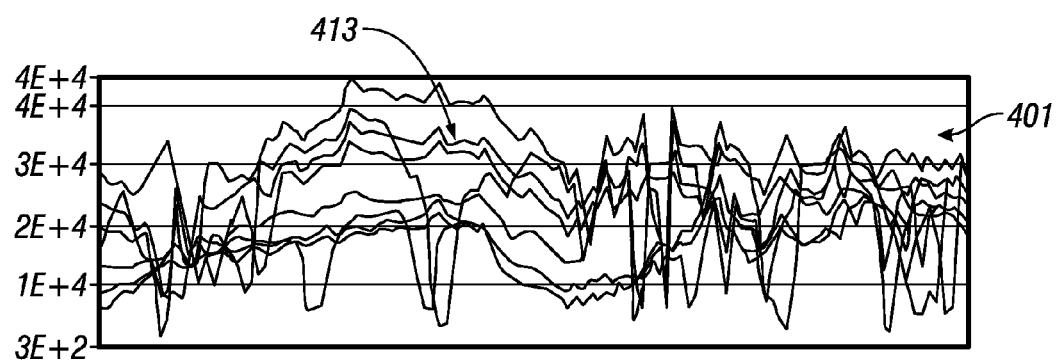
FIGS. 4A-4B shows charts illustrating the problem of "salt and pepper" noise in a resistivity image.
Figure 4B:
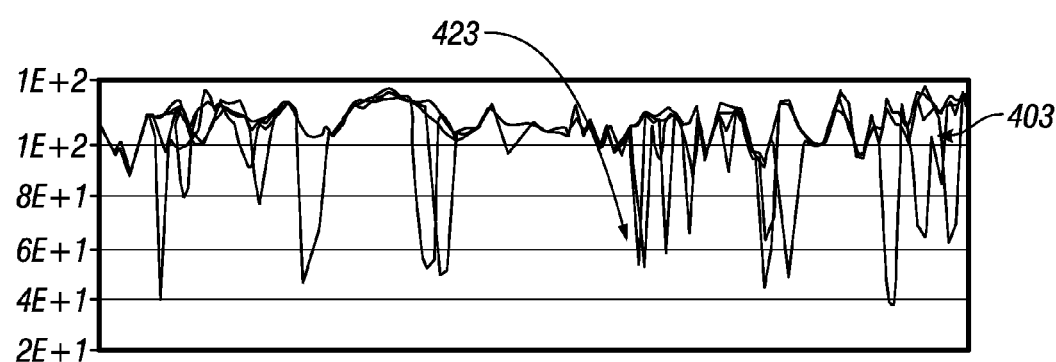

FIG. 4a shows an analysis of another image with amplitudes 401 and phases 403 in FIGS. 4a, 4b. It can be seen that the amplitudes in the portion 413 are not consistent from one electrode to another electrode. The phases 423 show "spikes" corresponding to some electrodes but not to other electrodes. This type of noise has a characteristic "salt and pepper" effect on the image.

Figure 5:
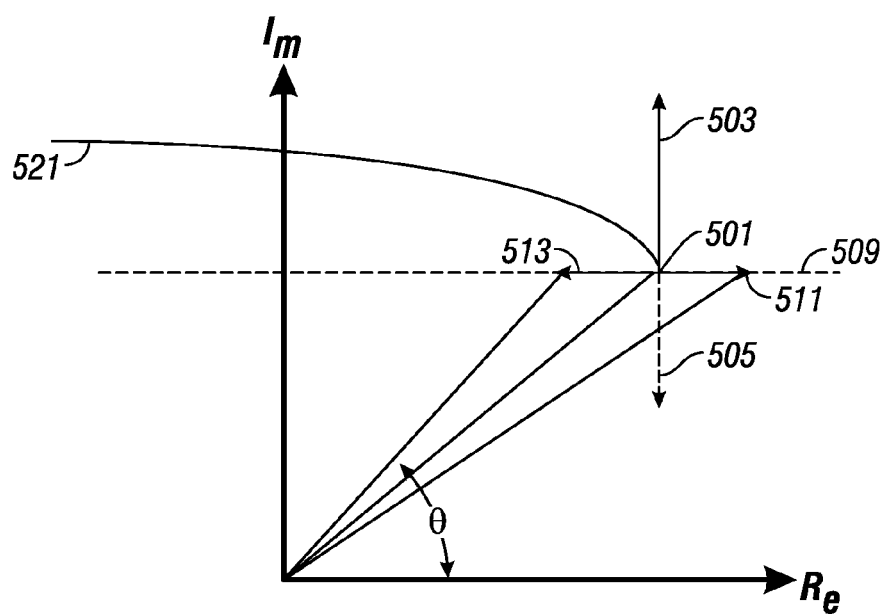
FIG. 5 illustrates the principle exploited in the processing scheme of one embodiment of the present disclosure.

The blocky/bar noises are caused by borehole rugosity. The rugosity of the borehole may cause the pad to move irregularly. The irregular movement can include jumps, tilts, and sticking. The standoff is not stable and can change dramatically. Leakage current is higher at higher frequencies. The interrelation between standoff and the real and imaginary parts of the measured impedance are illustrated in FIG. 5 and serves as a basis for the processing scheme.

The abscissa of the plot is the real part of the impedance $R_e$ and the ordinate is the imaginary part of the impedance $I_m$.

Shown in the plot is a point 501 that corresponds to a nominal standoff associated with an imaginary component of impedance of 509 due to the mud. Corresponding to the point 501 is a nominal phase angle θ. Points 503 and 505 correspond to increased and decreased offsets respectively. Similarly, points 513 and 511 correspond to reduced and increased formation resistivity respectively. All of these points are characterized by a positive correlation between the real and imaginary parts of the impedance. The effect of leakage current is indicated by 521 this results in a negative correlation between the real and imaginary parts of the impedance. The processing scheme is directed at improving the signal to noise ratio based on this negative correlation.

Figure 6:
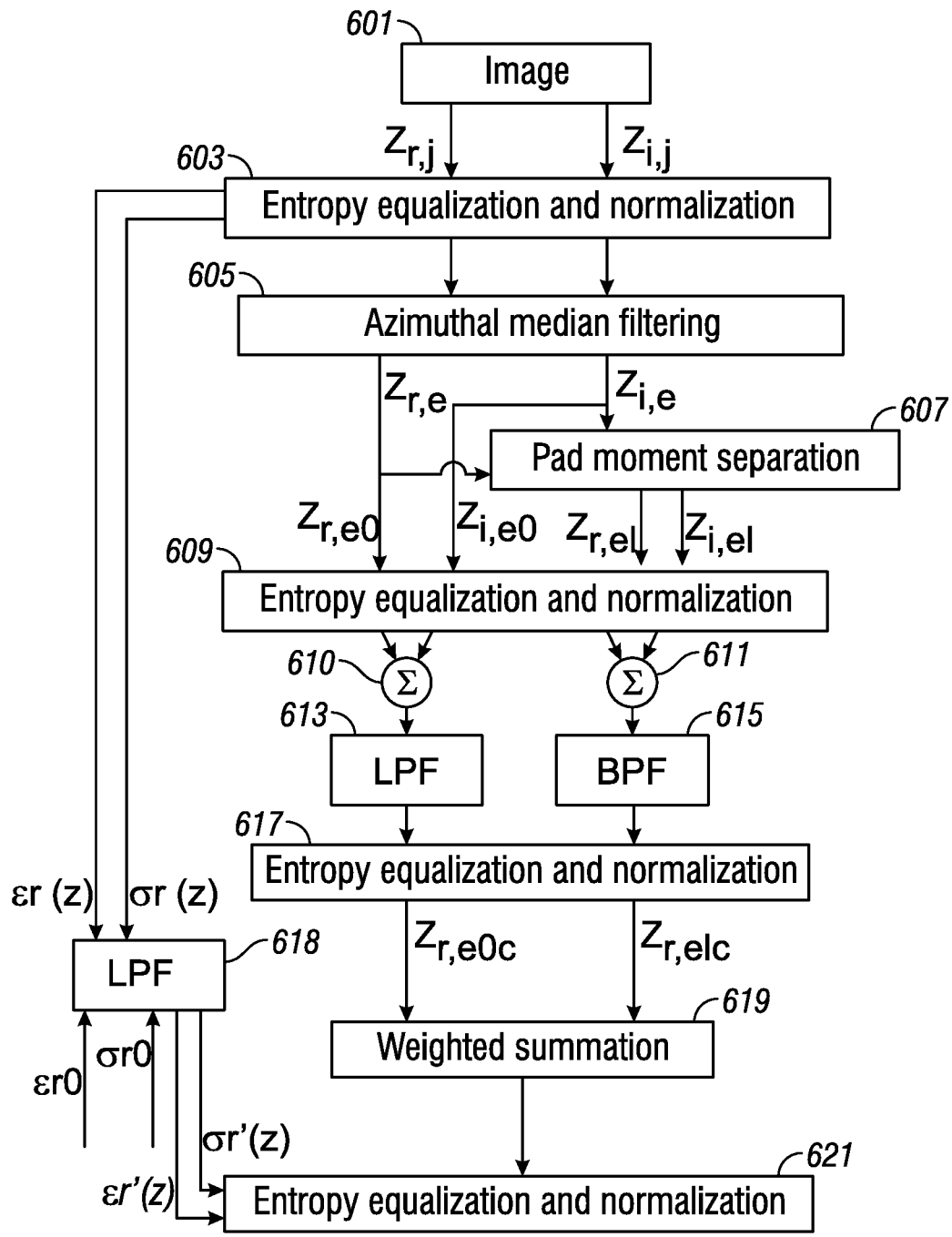
FIG. 6 shows a flow chart of some of the processing steps of one embodiment according to the present disclosure.

To deal with the different types of noises present on the image (bar/block, salt and pepper), a processing scheme has been developed that is depicted in FIG. 6. Starting with an image 601, recognition is made of the fact that the real and imaginary parts of the signal contain information: hence the real and imaginary parts of the signal $z_{r,j}$ and $z_{i,j}$ are separated. Here, the subscripts r and i refer to the real and imaginary parts of the signal z and the subscript j refers to a particular sample of the image. In a typical processing sequence, a window length of one to three meters is used. Data from all six pads (a total of 60 channels of data) are used. This gives a total of 120 channels of data when the real and imaginary parts are included.

The entropy of the real and imaginary components $z_{r,j}$ and $z_{i,j}$ is normalized 603. This may be done by:
1. Determining the mean and standard deviation of the 120 channels of data within the window;
3. Subtracting the mean from all 120 channels of data from the individual data points and dividing by the standard deviation. This gives the normalized data, entropy equalized data.
4. In addition, computing the mean and standard deviation for each channel of the normalized entropy equalized data. This gives $\epsilon r(z)$ and $\sigma r(z)$, used later in step 618.

The reason for doing equalization is that the image pixels are sampled through 60 different physical signal channels. All channels may be slightly different in term of AC gains and DC offsets. If AC gains and DC offsets are not corrected, the tool would produce a "bamboo screen pattern" that is not representative of formation features. The entropy equalization may be performed to make the AC gains and DC offsets consistent across all channels. For image processing, different values for the AC gains and DC offsets may be selected as long as image visualization quality remains acceptable. The effect of the entropy equalization and normalization is to compensate for differences in the physical channels.

Next, an azimuthal median filtering may be performed on the data 605. A three-point of five point median filtering has been found to be adequate to filter out the salt and pepper noise. The outputs of the median filtering are denoted by $z_{r,e}$ and $z_{i,e}$. A pad moment separation is carried out 607. In the pad moment separation, the mean of the median filtered data for each column is subtracted from the median filtered data:

$$S_1(x,z)=S_0(x,z)-E[S_0(x,z)]$$

where $S_0(x,z)$ is the median filtered data and E[.] is the expectation (mean value over z).

An entropy normalization is again carried out 609. This involves equalization of the original equalized real and imaginary images $z_{r,e0}$ and $z_{i,e0}$ as well as the first moment of the equalized real and imaginary images $z_{r,e1}$ and $z_{i,e1}$. The real and imaginary equalized zero moments from 609 are combined 610 to give a compensated base resistivity image. The real and imaginary equalized first moments from 609 are combined 611 to give a compensated first moment (textural) image. A low pass filter 613 is applied to the compensated base resistivity image and a bandpass filter 615 is applied to the compensated first moment image. A typical low pass filter has a cutoff of around 10 samples per foot. A typical bandpass filter is 3-13 samples per foot. Note that with a typical sampling rate of 60 samples per foot, the Nyquist frequency is 30 samples per foot.

A weighted summation is done 619 of the (normalized, 617) resistivity base image and the resistivity texture image using relative weight factors μ and 1-μ. The combined image (zero and first moment) from 619 are displayed using an AC gain and a DC offset value from 618. This adjusts the image signal dynamic range (contrast) and DC offset (brightness) for visualization. The AC gain $\epsilon r'$ and a $\sigma r'$ offset value $\sigma r'$ from 618 are obtained from the original AC gain $\epsilon r$ and DC offset $\sigma r$ plus an extra user provided AC gain $\epsilon r0$ and DC offset $\sigma r0$ for further adjustment. In one embodiment of the disclosure, the extra adjustment can be zero. The entropy equalization 621 may be done to adjust the brightness and contrast for visualization.

An example of results of using the method described above are shown in FIG. 7A-B. The panel 701 shows the real component of an image obtained in a well. Attention is drawn to the low signal feature 711 that is probably due to a large standoff associated with a washout. The possible washout is easier to identify in the processed section 703. The bedding plane is interpreted as being defined by the curve 721 that has the typical sinusoidal shape associated with the trace of a plane intersecting a circular borehole.

The entire interval labeled as 713 is dominated by horizontal events. The underlying dips in the formation such as 723 are easier to see in the processed section 703. The salt and pepper events indicated by 715 are not in the processed section and the underlying dips are easier to see.

Those versed in the art and having benefit of the present disclosure would know that identification of bedding planes and washouts in a borehole is an important part of development of a hydrocarbon reservoir. The bedding planes give the dip direction of the earth formation relative to the borehole. Such identification can be done visually or by a computer program that has a program that can perform a constrained curve fitting to the processed data to identify formation dips. Features such as breakouts (not seen in the example of FIGS. 7A-B) can be used to determine the direction of principal stresses in the formation. This is useful in determining the direction of further drilling or in the design of a "frac job" in which fluid is forced into the formation to produce hydraulic fractures: these hydraulic fractures then act as pathways for hydrocarbon recovery.

The disclosure above has been in the context of resistivity images obtained by a pad mounted tool. This is not to be construed as a limitation and the method described above can be used to process measurements made by other tools, such as a neutron porosity tool, and acoustic imaging tool, and a density logging tool. The key difference with the resistivity imaging tool is that the measurements are scalar quantities, so for each image pixel, there is only one component instead of the real and imaginary parts as for the resistivity imaging tool. The flow chart of FIG. 6 may be used for improving the image quality using only scalar measurements.

The processing of the data may be conveniently performed by at least one processor. The at least one processor may execute the method using instructions stored on a suitable non-transitory computer-readable medium product. The non-transitory computer-readable medium may include a ROM, an EPROM, an EAROM, a flash memory, and/or an optical disk.

What is claimed is:

1. A method of evaluating an earth formation, the method comprising:
   conveying a carrier into a borehole;
   making measurements indicative of a property of the earth formation using an array of sensors on each of a plurality of support members coupled to the carrier wherein at least one of the plurality of support members has a different standoff from a borehole wall than at least one other of the plurality of support members; and
   using a processor for compensating for an effect on the measurements caused by a difference in standoff by:
      processing in parallel two sets of data derived from a real part and an imaginary part of each measurement;
      performing an entropy equalization and normalization of the two sets of data; and
      combining the resultant two sets of equalized normalized data; and
   producing an image of the earth formation based on the compensation.

2. The method of claim 1 wherein the measurements include at least one of: (i) resistivity measurements, (ii) acoustic measurements, (iii) neutron porosity measurements, and (iv) density measurements.

3. The method of claim 1 wherein compensating for the effect of the difference in standoff further comprises another entropy equalization and normalization using an image and a first moment of the image.

4. The method of claim 1 wherein compensating for the effect of the difference in standoff further comprises a bandpass filtering.

5. The method of claim 1 further comprising using the processor for compensating for random noise in the measurements.

6. The method of claim 5 wherein compensating for the random noise further comprises a median filtering.

7. The method of claim 1 further comprising conveying the carrier into the borehole on a wireline.

8. The method of claim 1 further comprising controlling drilling operations based at least in part on the produced image.

9. An apparatus configured to evaluate an earth formation, the apparatus comprising:
   a carrier configured to be conveyed into a borehole;
   an array of sensors on each of a plurality of support members coupled to the carrier, each of the arrays of sensors being configured to make measurements indicative of a property of the earth wherein at least one of the plurality of support members has a different standoff from a borehole wall than at least one other of the plurality of support member; and
   a processor configured to:
      compensate for an effect on the measurements caused by a difference in standoff; and
      produce an image of the earth formation based on the compensation;
   wherein the processor is configured to compensate for the effect of the difference in standoff by:
      processing in parallel two sets of data derived from a real part and an imaginary part of each measurement;
      performing an entropy equalization and normalization of the two sets of data; and
      combining the resultant two sets of equalized normalized data.

10. The apparatus of claim 9 wherein the measurements include at least one of: (i) resistivity measurements, (ii) acoustic measurements, (iii) neutron porosity measurements, and (iv) density measurements.

11. The apparatus of claim 9 wherein the processor is configured to compensate for the effect of the difference in standoff further by further performing another entropy equalization and normalization using an image and a first moment of the image.

12. The apparatus of claim 9 wherein the processor is configured to compensate for the effect of the difference in standoff further by further performing a bandpass filtering.

13. The apparatus of claim 9 wherein the processor is further configured to compensate for random noise in the measurements.

14. The apparatus of claim 13 wherein the processor is configured to compensate for the random noise by further performing an azimuthal filtering.

15. The apparatus of claim 9 further comprising a wireline configured to convey the carrier into the borehole.

16. The apparatus of claim 9 wherein the processor is further configured to control drilling operations based at least in part on the produced image.

17. A non-transitory computer-readable medium product having thereon instructions that when read by a processor cause the processor to execute a method, the method comprising:
   compensating for an effect on measurements made by an array of sensors on each of a plurality of support members conveyed in a borehole by:
      processing in parallel two sets of data derived from a real part and an imaginary part of each measurement;
      performing an entropy equalization and normalization of the two sets of data; and
      combining the resultant two sets of equalized normalized data; and
   producing an image of the earth formation based on the compensation, wherein the measurements are indicative of a property of an earth formation, and wherein the effect is caused by a difference in standoff of the support members from a borehole wall.

18. The non-transitory computer-readable medium of claim 17 further comprising at least one of: (i) a ROM, (ii) an EPROM, (iii) an EAROM, (iv) a flash memory, and (v) an optical disk.

19. A method of evaluating an earth formation, the method comprising:
   conveying a carrier into a borehole;
   making measurements indicative of a property of the earth formation using an array of sensors on each of a plurality of support members coupled to the carrier wherein at least one of the plurality of support members has a different standoff from a borehole wall than at least one other of the plurality of support members; and
   using a processor for compensating for an effect on the measurements caused by a difference in standoff by:
      processing in parallel two sets of data derived from a real part and an imaginary part of each measurement;
      performing pad moment separation on the two sets of data to generate a first moment of the two sets of data comprising a third data set and a fourth data set;
      performing an entropy equalization and normalization of the two sets of data, the third data set and the fourth data set;
      performing a multistep summation of the resultant two sets of equalized normalized data, the resultant equalized normalized third data set, and the resultant equalized normalized fourth data set;

producing an image of the earth formation based on the compensation.

\* \* \* \* \*